United States Patent
El-Essawy et al.

(10) Patent No.: US 9,000,752 B2
(45) Date of Patent: Apr. 7, 2015

(54) MULTI-CONDUCTOR CABLE CURRENT AND VOLTAGE SENSORS

(75) Inventors: Wael El-Essawy, Austin, TX (US); Alexandre Peixoto Ferreira, Austin, TX (US); Thomas Walter Keller, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 922 days.

(21) Appl. No.: 13/159,554

(22) Filed: Jun. 14, 2011

(65) Prior Publication Data

US 2012/0319676 A1  Dec. 20, 2012

(51) Int. Cl.
G01R 1/20 (2006.01)

(52) U.S. Cl.
CPC .................... G01R 33/023 (2013.01)

(58) Field of Classification Search
USPC .............. 324/76.11, 93, 116–126, 149–153
See application file for complete search history.

(56) References Cited

U.S. PATENT DOCUMENTS

| | | |
|---|---|---|
| 4,005,380 A | 1/1977 | Heilmann et al. |
| 4,266,189 A | 5/1981 | Karlin et al. |
| 4,378,525 A | 3/1983 | Burdick |
| 4,558,276 A | 12/1985 | Comeau et al. |
| 5,473,244 A | 12/1995 | Libove et al. |
| 5,610,512 A | 3/1997 | Selcuk |
| 5,867,020 A | 2/1999 | Moore et al. |
| 6,008,634 A | 12/1999 | Murofushi et al. |
| 6,414,474 B1 | 7/2002 | Gohara et al. |
| 6,522,509 B1 | 2/2003 | Engel et al. |
| 6,654,219 B1 | 11/2003 | Romano et al. |
| 6,661,239 B1 | 12/2003 | Ozick |
| 6,703,842 B2 | 3/2004 | Itimura et al. |
| 6,708,126 B2 | 3/2004 | Culler et al. |

(Continued)

FOREIGN PATENT DOCUMENTS

| | | |
|---|---|---|
| CN | 101329370 A | 12/2008 |
| CN | 201654106 U | 11/2010 |

(Continued)

OTHER PUBLICATIONS

U.S. Appl. No. 13/682,112, filed Nov. 20, 2012, Carpenter, et al.

(Continued)

Primary Examiner — Melissa Koval
Assistant Examiner — Trung Nguyen
(74) Attorney, Agent, or Firm — Mitch Harris, Atty at Law, LLC; Andrew M. Harris; William J. Stock (57) ABSTRACT

A detachable current sensor provides an isolated and convenient device to measure current passing through a cable such as an AC power cable or non-metallic (NM) sheathed cable. Information about the magnitude and or phases of the currents passing through and/or voltages on the conductors is obtained by measuring the magnetic field at multiple circumferential positions around the cable using multiple semiconductor magnetic field sensors. A processing subsystem coupled to the multiple semiconductor magnetic field sensors determines information about the currents flowing in the conductors of the cable, including the current magnitude(s), and/or the phases and number of phases present in the cable, which can form part of a power measurement system that is used for energy monitoring, and/or for control purposes.

19 Claims, 5 Drawing Sheets

(56) References Cited

U.S. PATENT DOCUMENTS

| | | |
|---|---|---|
| 6,825,649 B2 | 11/2004 | Nakano |
| 6,940,291 B1 | 9/2005 | Ozick |
| 7,068,045 B2 | 6/2006 | Zuercher et al. |
| 7,098,644 B1 | 8/2006 | Denison |
| 7,148,675 B2 | 12/2006 | Itoh |
| 7,227,348 B2 | 6/2007 | Sorenson |
| 7,230,413 B2 | 6/2007 | Zhang et al. |
| 7,265,533 B2 | 9/2007 | Lightbody et al. |
| 7,315,161 B2 | 1/2008 | Zribi et al. |
| 7,330,022 B2 | 2/2008 | Bowman et al. |
| 7,474,088 B2 | 1/2009 | Bowman et al. |
| 7,493,222 B2 | 2/2009 | Bruno |
| 7,546,214 B2 | 6/2009 | Rivers, Jr. et al. |
| 7,622,912 B1 | 11/2009 | Adams et al. |
| 7,714,594 B2 | 5/2010 | Ibuki et al. |
| 7,719,257 B2 | 5/2010 | Robarge et al. |
| 7,719,258 B2 | 5/2010 | Chen et al. |
| 7,847,543 B2 | 12/2010 | Grno |
| 7,936,164 B2 | 5/2011 | Doogue et al. |
| 7,990,133 B2 | 8/2011 | Dockweiler |
| 2004/0227503 A1 | 11/2004 | Bowman |
| 2004/0257061 A1 | 12/2004 | George de Buda |
| 2005/0156587 A1 | 7/2005 | Yakymyshyn et al. |
| 2006/0087777 A1 | 4/2006 | Bruno |
| 2007/0058304 A1 | 3/2007 | Parker et al. |
| 2008/0077336 A1 | 3/2008 | Fernandes |
| 2008/0079437 A1 | 4/2008 | Robarge et al. |
| 2009/0105973 A1 | 4/2009 | Choi et al. |
| 2010/0001715 A1 | 1/2010 | Doogue et al. |
| 2010/0231198 A1 | 9/2010 | Bose et al. |
| 2010/0264944 A1 | 10/2010 | Rupert |
| 2010/0271037 A1 | 10/2010 | Blakely |
| 2010/0283487 A1 | 11/2010 | Juds et al. |
| 2011/0084688 A1* | 4/2011 | Sorensen ..................... 324/96 |
| 2012/0200285 A1 | 8/2012 | Carpenter et al. |
| 2012/0200293 A1 | 8/2012 | Carpenter et al. |
| 2012/0319674 A1 | 12/2012 | El-Essawy et al. |
| 2013/0099775 A1* | 4/2013 | Mitsuya ..................... 324/126 |

FOREIGN PATENT DOCUMENTS

| | | |
|---|---|---|
| JP | 06174753 A | 6/1994 |
| JP | H09281146 A | 10/1997 |
| WO | WO2009042414 A2 | 4/2009 |

OTHER PUBLICATIONS

U.S. Appl. No. 13/596,658, filed Aug. 8, 2012, El-Essawy, et al.

U.S. Appl. No. 13/024,199, filed Feb. 9, 2011, Carpenter, et al.

U.S. Appl. No. 13/024,181, filed Feb. 9, 2011, Carpenter, et al.

"AC Current sensor with Interface" downloaded from: http://www.electronicspoint.com/ac-current-sensor-interface-t221239.html on Jun. 10, 2011.

"Smart Current Signature Sensor" downloaded from http://technology.ksc.nasa.gov/successes/SS-Smart-Current-Signal-Snsr.htm on Jun. 10, 2011.

Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 24, 2011.

Valuetesters.com on-line catalog: "non-contact voltage probes", downloaded from http://valuetesters.com/Voltage-Probe-Non-contact.php on May 24, 2011.

McKenzie, et al. "Non-contact Voltage Measurement using Electronically Varying Capacitance", Electronics Letters, Feb. 4, 2010, vol. 46, No. 3, UK.

Silicon Chip, "Current Clamp Meter Adapter for DMMs", issue 180, published Sep. 12, 2003.

Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.

Ziegler, et al., "Current Sensing Techniques: A Review", IEEE Sensors Journal, Apr. 2009, pp. 354-376 vol. 9, No. 4. Piscataway, NJ.

* cited by examiner

MULTI-CONDUCTOR CABLE CURRENT AND VOLTAGE SENSORS

BACKGROUND OF THE INVENTION

1. Field of the Invention

The present invention is related to sensors providing input to power measurement systems, and more specifically to a non-contact current sensor that includes multiple semiconductor magnetic field sensors and/or voltage sensors that can be used to detect characteristics of currents flowing through, and/or electrical potentials on, multiple conductors in a cable.

2. Description of Related Art

A need to measure power consumption in AC line powered systems is increasing due to a focus on energy efficiency for both commercial and residential locations. In order to provide accurate measurements, the characteristics of the load must be taken into account along with the current drawn by the load. Information about the electrical potentials on conductors, i.e., the power line voltages, including magnitudes and/or phase, are also useful for determining power factor and thus actual power transfer to a load.

Appliances and other devices are typically provided electrical power through multiple conductor cables both in wall-plug applications and in wiring systems that use non-metallic (NM) sheathed electrical cable.

Therefore, it would be desirable to provide a sensor that can provide current draw information from a cable carrying AC line current to an appliance or other device.

BRIEF SUMMARY OF THE INVENTION

The invention is embodied in a current sensing device and its method of operation. The current sensing device includes multiple semiconductor magnetic field sensors integrated in a housing that can be detachably coupled to a multi-conductor cable and provides one or more outputs indicative of the currents passing through multiple conductors of the cable.

The housing may be a clamshell that clamps around the cable, and the semiconductor magnetic field sensors embedded in the housing at positions around the circumference of an opening that accepts the cable. Ferrite or other high-permeability bodies may be included between the semiconductor magnetic field sensors and the cable to increase the magnetic field intensity in the vicinity of the sensors. A ferrite or other high-permeability material shield may be provided around the outer portion of the housing to shield the semiconductor magnetic field sensors from external magnetic field sources.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses a sensor and measurement techniques for performing non-invasive current measurements on multi-conductor cables that provide sensor measurements as input to power measurement systems, as well as for other uses. For example, the present invention can provide input to power monitoring equipment that monitors the power consumption of various appliances or branch circuits supplied by multi-conductor cables.

Figure 1A:
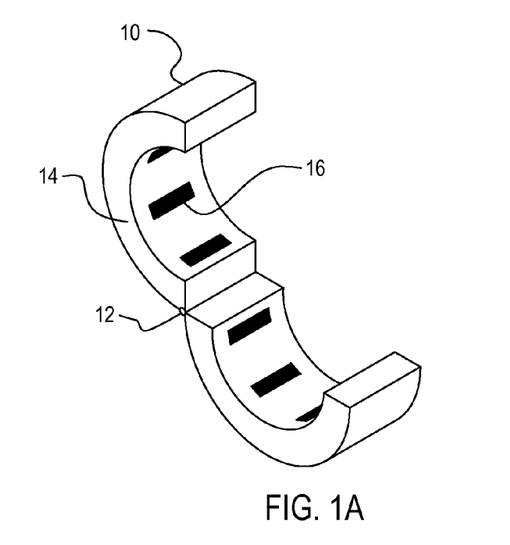
FIG. 1A and FIG. 1B are isometric views of a multi-conductor cable current sensor 10 according to an embodiment of the present invention.
Figure 1B:
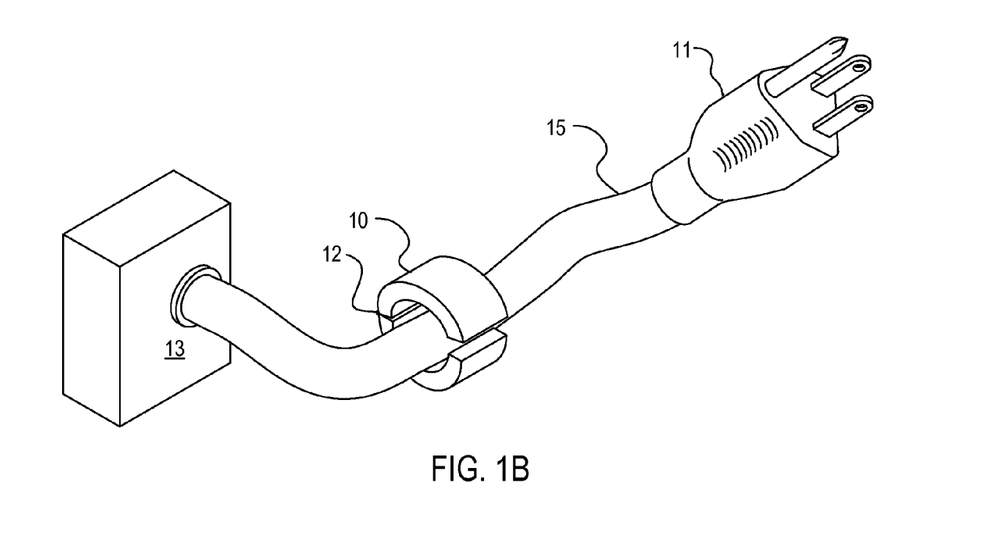

Referring now to FIGS. 1A-1B, a sensor 10 in accordance with an embodiment of the present invention is shown. Sensor 10 is formed by a housing 14 in which multiple semiconductor magnetic field sensors 16, such as Hall effect sensors, are disposed in a circumferential arrangement around a multi-conductor cable 15 that is passed through an opening in sensor 10. Housing 14 forms a clamshell arrangement that is hinged by a plastic hinge 12 and may include latching mechanisms or other mechanisms for securing sensor 10 in a closed position around cable 15. FIG. 1B illustrates an appliance cord that may be attached to a wall outlet via a plug 11 and which connects an appliance 13 to a source of AC power. However, the present invention can be used in other current monitoring situations, in order to determine the relationship between, and in some embodiments the magnitude of, the currents within the conductors of multi-conductor cable 15.

Figure 2A:
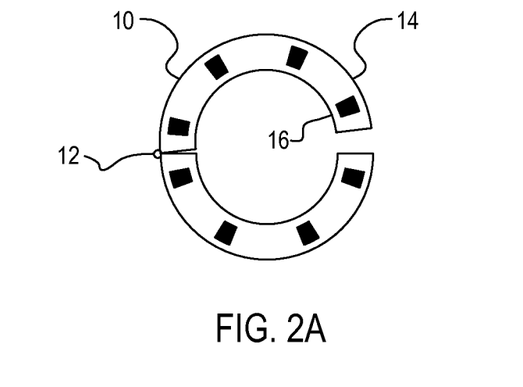
FIGS. 2A-2C are cross-section views of sensors according to different embodiments of the present invention.

Referring now to FIG. 2A, details of sensor 10 of FIGS. 1A-1B are shown in cross-section, in accordance with an embodiment of the present invention. Within housing 14, semiconductor magnetic field sensors 16 are disposed at various circumferential positions around the opening provided through housing 14. By comparing the phase and magnitudes of the output voltages of semiconductor magnetic field sensors 16, information about the phase and amplitudes of the conductors in a multi-conductor cable passing through the opening defined by housing can be obtained.

Figure 2B:
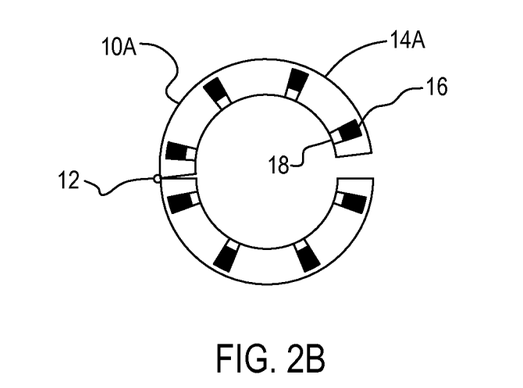

Referring now to FIG. 2B, details of another sensor 10A in accordance with an alternative embodiment of the present invention are shown. Sensor 10A may be used instead of sensor 10 in the depictions of FIGS. 1A-1B. Sensor 10A includes a plurality of bodies 18 formed from a high permeability material, such as ferrite, that cause the field around a cable inserted through the opening in housing 14A to be concentrated in the vicinity of semiconductor magnetic field sensors 16, improving the signal strength and signal-to-noise ratio (SNR) of the output voltages of sensors 16.

Figure 2C:
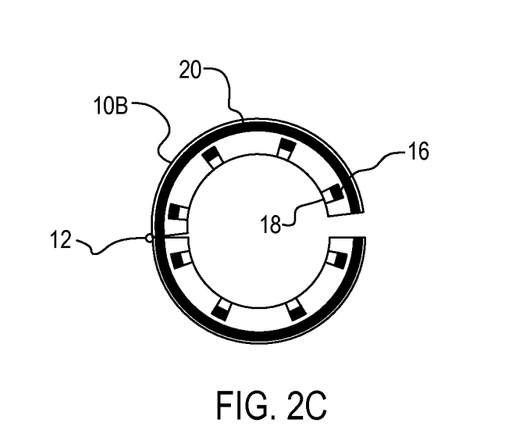

Referring now to FIG. 2C, details of yet another sensor 10B in accordance with another alternative embodiment of the present invention, that may be used instead of sensor 10 in the depictions of FIGS. 1A-1B, is shown. Sensor 10A also includes a plurality of high-permeability bodies 18 as in sensor 10A of FIG. 2B, that cause the field around a cable inserted through the opening in housing 14A to be concentrated in the vicinity of semiconductor magnetic field sensors 16, improving the signal strength and signal-to-noise ratio (SNR) of the output voltages of sensors 16. Sensor 10B also includes a shield 20 molded within or covering the exterior surface of housing 14 and formed from a high permeability material, which may ferrite, mu-metal or another suitable magnetic field shielding material. Alternatively, a shield may be formed from a lower permeability material such as steel. Shield 20 further improves the SNR of the output voltages of sensors 16, since shield 20 prevents coupling from stray fields external to housing 14.

Figure 3:
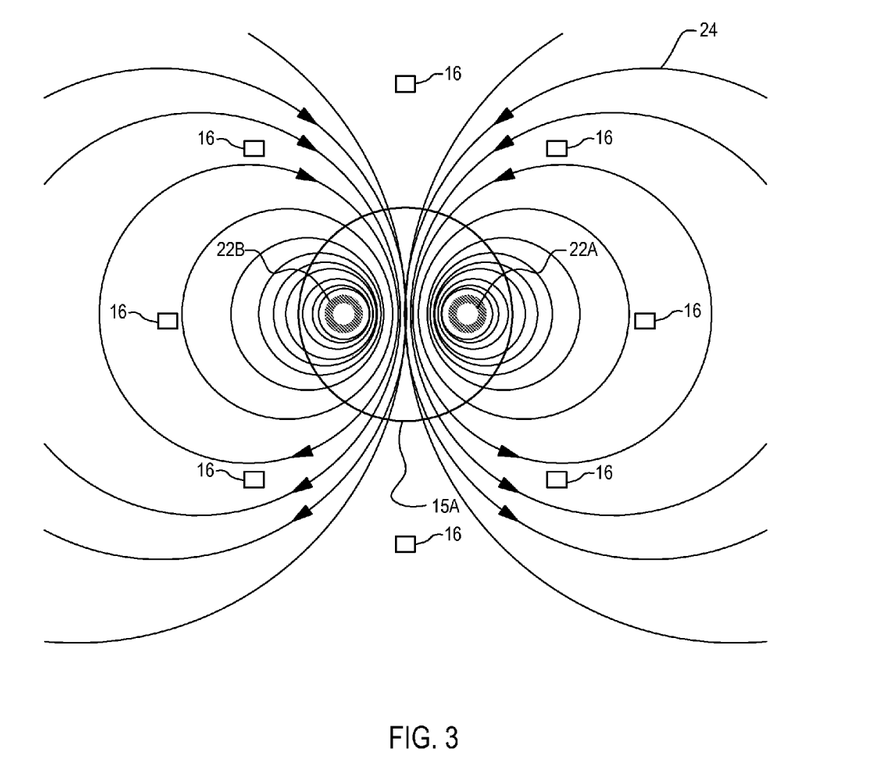
FIG. 3 is a pictorial diagram depicting a magnetic field around a cable in which currents are measured by sensors 16 connected to a system according to an embodiment of the present invention.

Referring now to FIG. 3, a magnetic field distribution around a pair of conductors 22A,22B, that are carrying complementary currents within a cable 15A, is shown. The fields 24 around conductors 22A,22B cancel at the midpoint between conductors 22A,22B, when measurements are taken at a point outside of cable 15A. Therefore, sensors 16 that are located on the vertical centerline (i.e., sensors 16 at the "12 o'clock" and "6 o'clock" positions in the Figure) will have little or no signal output compared to sensors 16 at the other positions in the Figure. Similarly, sensor 16 at the "3 o'clock" position has a much stronger coupling to conductor 22A than to conductor 22B, and so the field due to the current flowing in conductor 22A will predominate in the output of the "3 o'clock" sensor 16. The "9 o'clock" sensor will similarly have a strong coupling to conductor 22B and a weaker coupling to conductor 22A, and thus the field due to the current in conductor 22B will predominate. The other sensors 16 will have output values between those of the sensors in the cardinal orientations mentioned above.

Figure 4:
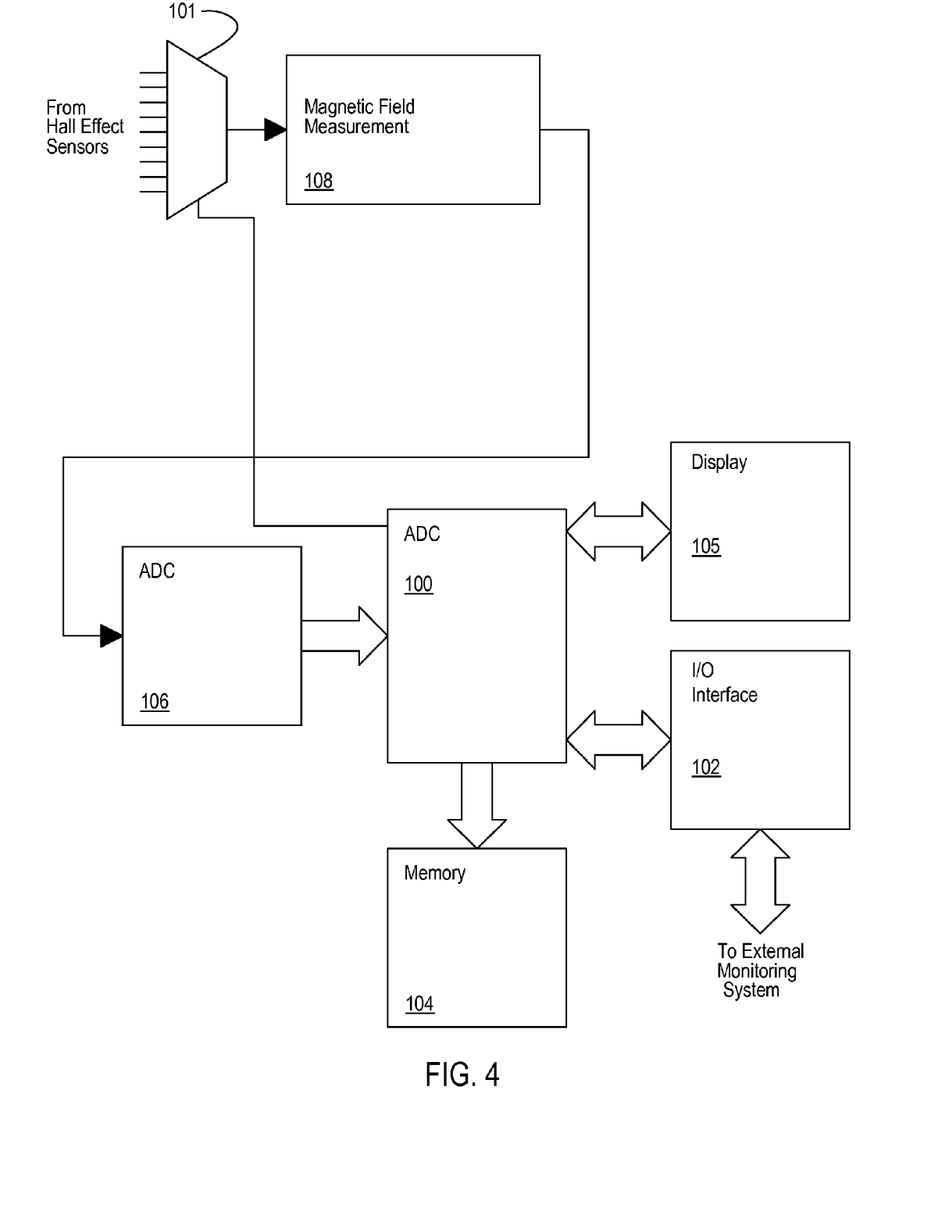
FIG. 4 is an electrical block diagram illustrating an electronic system in accordance with an embodiment of the present invention.

Referring now to FIG. 4, a system in accordance with an embodiment of the present invention are shown. A multiplexer 101 receives signals from the individual magnetic field sensors 16 and selects a sensor for measurement, providing input to a magnetic field measurement circuit 108, which is an analog circuit that appropriately scales and filters the output of sensors 16. The output of magnetic field measurement circuit 108 is provided as an input to an analog-to-digital converter (ADC) 106, which converts the output waveforms generated by current measurement circuit 108 to sampled values provided to a central processing unit (CPU) 100 that performs calculations in accordance with program instruction stored in a memory 104 coupled to CPU 104. Alternatively, a separate magnetic field measurement circuit 108 and multiplexer 101A may not be necessary, and sensors 16 may be coupled directly to ADC 106. An input/output (I/O) interface 102 provides either a wireless or wired connection to an external monitoring system, such as a wireless local area network (WLAN) connection or wired Ethernet connection. An integrated display 105 may be additionally or alternatively provided to indicate a direct measure of current in a conductor. CPU 104 can perform computations to discover and map the phases of conductors in a cable, as the invention is not limited to 2-phase systems such as that depicted in FIG. 3. Further, cable configurations such as multiple conductors corresponding to a single return conductor may be measured and a net current magnitude value determined. The power measurement system depicted in FIG. 4 may be integrated within or on an outside surface of sensor housing 14, and all wiring from sensors 16 to multiplexer 101 integrated within sensor housing 14. Alternatively, wiring may be routed from sensors 16 outside of sensor housing 14 and connected to an external enclosure and/or circuit board that contains the electronic circuits shown in FIG. 4. Power for the circuits shown in FIG. 4 may be supplied from two conductors connected to an external battery or power supply. Alternatively, a battery may be mounted within sensor housing 14 or attached externally to sensor housing 14. Alternatively, sensor 16 may use a high permeability conductive surface and obtain power supply current, e.g., to charge a power supply capacitor, from eddy currents generated in the conductive surface, which can, in turn, be used to power the system depicted in FIG. 4.

The measurements made by the above-described system provides a signature of the currents in cable 15A and/or a signature of the power consumed by an appliance connected via cable 15A, and not necessarily an absolute current or power magnitude. While the "gain" of a particular sensor 16, i.e., the ratio of the output of a sensor 16 to a current flowing in one of conductors 22A, 22B is unknown, measurements can be performed by observing the relative values obtained from each of sensors 16, both in amplitude and in phase. For example, the strongest output from among sensors 16 may be taken as a measurement value and the values from the other sensors subtracted to eliminate noise and/or serve to detect faulty measurements. The waveforms generated by the outputs of each of sensors 16 may be processed, e.g., by performing fast-Fourier transforms (FFTs) on the sampled values to determine power line harmonics, power line noise, and time-dependent variations in load current(s) associated with conductors within a cable.

Figure 5A:
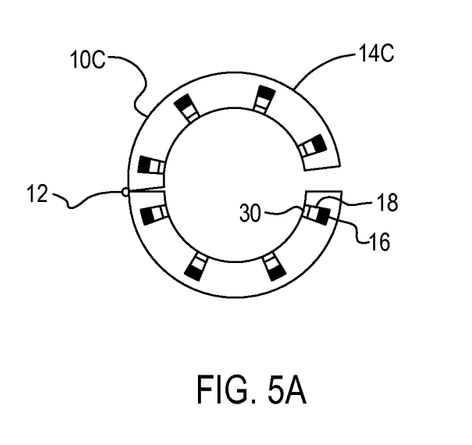
FIGS. 5A and 5B are cross-section view of sensors according to alternative embodiments of the present invention.

Referring now to FIG. 5A, details of another sensor 10C in accordance with an alternative embodiment of the present invention are shown. Sensor 10C has other details as illustrated in FIGS. 1A-1B, although sensor 10C incorporates voltage sensing elements 30, in addition to magnetic field sensors 16. Voltage sensing elements 30 may be conductive films or structures that may be provided by metal films adhered to or plated on the inner surface of high-permeability bodies 18 within housing 14C, or if high-permeability bodies 18 are sufficiently conductive, high-permeability bodies 18 may be used as voltage sensing elements 30. Further, in accordance with an alternative embodiment of the invention, high-permeability bodies 18 are omitted and voltage sensing elements are disposed directly on the inner surfaces of magnetic field sensors 16. Connections from voltage sensing elements 30 are made to multiplexer 101B of the system depicted in FIG. 4 and provide voltages indicative of the electrostatic field around cable 15, which provides further information about the position of the conductors of cable 15 within sensor 10C and the phase and/or magnitude of the voltages on those conductors.

Figure 5B:
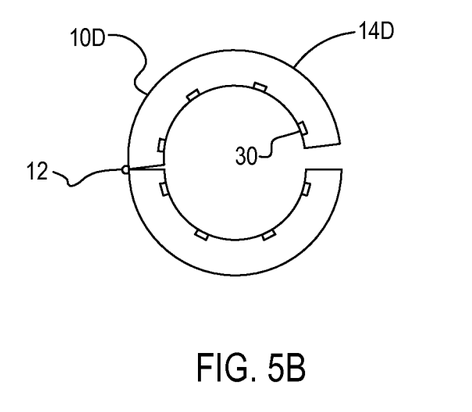

Referring now to FIG. 5B, details of another sensor 10D in accordance with an alternative embodiment of the present invention are shown. Sensor 10D has other details as illustrated in FIGS. 1A-1B, although sensor 10D incorporates only voltage sensing elements, and is for use in applications in which voltage sensing is needed, and current sensing is not needed, or is provided via other means. Sensor 10D includes a plurality of voltage sensing elements 30, which are conductive films or other structures, disposed around the inner surface of a housing 14D, which may be molded from a plastic material. Connections from voltage sensing elements 30 are made to multiplexer 101B of the system depicted in FIG. 4 and provide voltages indicative of the electrostatic field around cable 15, which provides further information about the position of the conductors of cable 15 within sensor 10C and the phase and/or magnitude of the voltages on those conductors.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A sensor for sensing properties of currents passing through conductors in a multi-conductor cable, the sensor comprising:
   a housing for detachably coupling the sensor to the cable, wherein the housing defines an opening for receiving the cable when the sensor is coupled to the cable;
   a plurality of semiconductor magnetic field sensors integrated in the housing and disposed circumferentially around the opening, whereby at least some of the semiconductor magnetic field sensors are located at differing distances from the conductors when the sensor is coupled to the cable, wherein the plurality of semiconductor magnetic field sensors provide corresponding outputs indicative of the properties of the currents that differ due to the differing distances; and
   a plurality of ferrite bodies corresponding to the semiconductor magnetic field sensors and disposed between the corresponding semiconductor magnetic field sensors and the opening.

2. The sensor of claim 1, wherein the housing comprises at least two housing portions rotatably coupled along an axis parallel to the central axis of the opening and disposed at a circumference of the housing, whereby the housing forms a clamshell that can be secured around the cable when the cable is disposed within the opening.

3. The sensor of claim 1, further comprising a shield formed from a high permeability material disposed between the semiconductor field sensor and an outer face of the housing.

4. The sensor of claim 3, further comprising a plurality of ferrite bodies, corresponding to the semiconductor magnetic field sensors and disposed between their semiconductor magnetic field sensors and the opening.

5. The sensor of claim 1, further comprising a plurality of voltage sensing conductors disposed circumferentially around the opening for sensing an electrostatic field indicative of one or more voltages on the conductors.

6. A method for sensing properties of currents passing through conductors in a multi-conductor cable, the method comprising:
   detachably coupling a housing of a current sensor around the cable;
   measuring a magnetic field property at multiple circumferential positions around a cable in a plane substantially perpendicular to the direction of current flow in the cable using multiple semiconductor magnetic field sensors disposed at the multiple circumferential positions around the cable;
   concentrating a magnetic field generated by the currents at the multiple circumferential positions by providing a plurality of ferrite bodies corresponding to the semiconductor magnetic field sensors and disposed between the semiconductor magnetic field sensors and the cable; and
   determining properties of currents flowing in the conductors of the cable from results of the measuring.

7. The method of claim 6, wherein the housing defines an opening for receiving the cable when the sensor is coupled to the cable, and wherein the plurality of semiconductor magnetic field sensors are integrated in the housing and disposed circumferentially around the opening, whereby at least some of the semiconductor magnetic field sensors are located at differing distances from the conductors when the sensor is coupled to the cable, wherein the plurality of semiconductor magnetic field sensors provide corresponding outputs indicative of the properties of the currents that differ due to the differing distances.

8. The method of claim 7, wherein the housing comprises at least two housing portions rotatably coupled along an axis parallel to the central axis of the opening and disposed at a circumference of the housing, wherein the detachably coupling secures a clamshell formed by the housing around the cable.

9. The method of claim 1, further comprising shielding the semiconductor magnetic field sensors using a shield formed from a high permeability material disposed between the semiconductor field sensors and an outer face of the housing.

10. The method of claim 6, wherein the magnetic field property is a magnitude of a magnetic field resulting from the currents, and further comprising determining, from magnitudes of the results of the measuring, a magnitude of at least one of the currents.

11. The method of claim 6, wherein the magnetic field property is a phase of a magnetic field resulting from the currents, and further comprising determining, from measurements of the phase, a phase relationship between two or more of the conductors.

12. The method of claim 11, further comprising determining a number of conductor phases present in the cable from the phase relationship between the two or more of the conductors.

13. The method of claim 1, further comprising:
   second measuring an electrostatic field property at multiple circumferential positions around the cable using voltage sensing conductors disposed circumferentially around the housing; and
   determining properties of electric potentials on the conductors of the cable from results of the second measuring.

14. A system for measuring current drawn by a device coupled to an AC power source by a multi-conductor cable, the system comprising:
   a sensor having a housing for detachably coupling the sensor to the cable, wherein the housing defines an opening for receiving the cable when the sensor is coupled to the cable, a plurality of semiconductor magnetic field sensors integrated in the housing and disposed circumferentially around the opening a plurality of ferrite bodies corresponding to the semiconductor magnetic field sensors and disposed between the semiconductor magnetic field sensors and the opening; and
   a processing subsystem having inputs for receiving outputs from the plurality of semiconductor magnetic field sensors to determine properties of currents flowing in conductors of the multi-conductor cable, wherein at least some of the semiconductor magnetic field sensors are located at differing distances from the conductors when the sensor is coupled to the cable, whereby the processing subsystem determines the properties of the currents flowing in the conductors.

15. The system of claim 14, further comprising a shield formed from a high permeability material disposed between the semiconductor field sensor and an outer circumferential face of the housing.

16. The system of claim 14, wherein the magnetic field property is a magnitude of a magnetic field resulting from the currents, and further comprising determining, from magnitudes of the results of the measuring, a magnitude of at least one of the currents.

17. The system of claim 14, wherein the magnetic field property is a phase of a magnetic field resulting from the currents, and further comprising determining, from measurements of the phase, a phase relationship between two or more of the conductors.

18. The system of claim 17, wherein the processing subsystem further determines a number of conductor phases present in the cable from the phase relationship between the two or more of the conductors.

19. The system of claim 14, wherein the sensor further comprises a plurality of voltage sensing conductors integrated in the housing and disposed circumferentially around the opening, and wherein the processing subsystem has second inputs for receiving outputs from the plurality of voltage sensing conductors to determine properties of electric potentials on the conductors of the multi-conductor cable.

\* \* \* \* \*